(12) United States Patent
Huang et al.

(10) Patent No.: US 12,148,809 B2
(45) Date of Patent: Nov. 19, 2024

(54) LAYOUT PATTERN OF STATIC RANDOM ACCESS MEMORY

(71) Applicant: UNITED MICROELECTRONICS CORP., Hsin-Chu (TW)

(72) Inventors: Chun-Hsien Huang, Tainan (TW); Yu-Tse Kuo, Tainan (TW); Shu-Ru Wang, Taichung (TW); Chien-Hung Chen, Taipei (TW); Li-Ping Huang, Miaoli County (TW); Chun-Yen Tseng, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 404 days.

(21) Appl. No.: 17/583,225

(22) Filed: Jan. 25, 2022

(65) Prior Publication Data
US 2023/0207648 A1    Jun. 29, 2023

(30) Foreign Application Priority Data
Dec. 23, 2021    (CN) .......................... 202111588319.7

(51) Int. Cl.
| | |
|---|---|
| *H01L 29/423* | (2006.01) |
| *G11C 5/06* | (2006.01) |
| *G11C 11/412* | (2006.01) |
| *H01L 29/78* | (2006.01) |
| *H10B 10/00* | (2023.01) |

(52) U.S. Cl.
CPC ........ *H01L 29/42376* (2013.01); *G11C 5/063* (2013.01); *G11C 11/412* (2013.01); *H01L 29/7851* (2013.01); *H10B 10/12* (2023.02)

(58) Field of Classification Search
CPC ........... H01L 29/42376; H01L 29/7851; H01L 27/0924; H01L 27/0207; G11C 5/063; G11C 11/412; G11C 8/16; H10B 10/12
USPC ........................................................ 257/288
See application file for complete search history.

(56) References Cited

U.S. PATENT DOCUMENTS

| | | | |
|---|---|---|---|
| 8,675,397 B2 | 3/2014 | Liaw | |
| 9,646,974 B1 | 5/2017 | Liaw | |
| 9,780,099 B1 * | 10/2017 | Yeh | ........................ G11C 11/412 |
| 10,177,132 B2 * | 1/2019 | Wang | ..................... G11C 11/412 |
| 10,529,723 B2 * | 1/2020 | Yeh | ........................ H01L 27/0207 |
| 11,088,151 B2 * | 8/2021 | Fujiwara | ................. G11C 5/063 |
| 11,889,673 B2 * | 1/2024 | Han | ......................... G11C 5/063 |
| 2020/0020699 A1 * | 1/2020 | Fujiwara | .............. H01L 23/5286 |

* cited by examiner

*Primary Examiner* — Vu A Vu
(74) *Attorney, Agent, or Firm* — Winston Hsu

(57) ABSTRACT

The present invention provides a layout pattern of static random access memory, comprising a PU1 (first pull-up transistor), a PU2 (second pull-up transistor), a PD1A (first pull-down transistor), a PD1B (second pull-down transistor), a PD2A (third pull-down transistor), a PD2B (fourth pull-down transistor), a PG1A (first access transistor), a PG1B (second access transistor), a PG2A (third access transistor) and a PG2B (fourth access transistor) located on the substrate. The PD1A and the PD1B are connected in parallel with each other, the PD2A and the PD2B are connected in parallel with each other, wherein the gate structures include a first J-shaped gate structure, and the first J-shaped gate structure is an integrally formed structure.

11 Claims, 5 Drawing Sheets

LAYOUT PATTERN OF STATIC RANDOM ACCESS MEMORY

BACKGROUND OF THE INVENTION

1. Field of the Invention

The present invention relates to a static random access memory (SRAM), in particular to a layout pattern of SRAM for improving the performance of the pull-down transistor (PD).

2. Description of the Prior Art

An embedded static random access memory (SRAM) comprises a logic circuit and a static random access memory connected to the logic circuit. SRAM is a kind of volatile memory cell, which means it preserves data only while power is continuously applied. SRAM is built of cross-coupled inverters that store data during the time that power remains applied, unlike dynamic random access memory (DRAM) that needs to be periodically refreshed. Because of its high access speed, SRAM is also used in computer systems as a cache memory.

However, as gap of the exposure process decreases, it has been difficult for the current SRAM architecture to produce desirable patterns. Hence, how to enhance the current SRAM architecture for improving exposure quality has become an important task in this field.

SUMMARY OF THE INVENTION

The invention provides a layout pattern of a static random access memory (SRAM), comprising a plurality of fin structures located on a substrate, a plurality of gate structures located on the substrate, the plurality of gate structures span the plurality of fin structures, to form a PU1 (first pull-up transistor), a PU2 (second pull-up transistor), a PD1A (first pull-down transistor), a PD1B (second pull-down transistor), a PD2A (third pull-down transistor), a PD2B (fourth pull-down transistor), a PG1A (first access transistor), a PG1B (second access transistor), a PG2A (third access transistor) and a PG2B (fourth access transistor) on the substrate, the PD1A and the PD1B are connected in parallel, and the PD2A and the PD2B are connected in parallel, the plurality of gate structures include a first J-shaped gate structure, the first J-shaped gate structure spans a part of the fin structures and forms the PU1, the PD1A and the PD1B, the first J-shaped gate structure comprises a long side structure, a short side structure and a connection structure, and the first J-shaped gate structure is an integrally formed structure.

According to the invention, under the condition of not adding additional processes, the gate structure with a curved shape is manufactured, so that the area of the element can be effectively utilized, and the problem of possible uneven stress in unit area can be reduced, the size of the element can be reduced, and the stability of the element can be improved.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
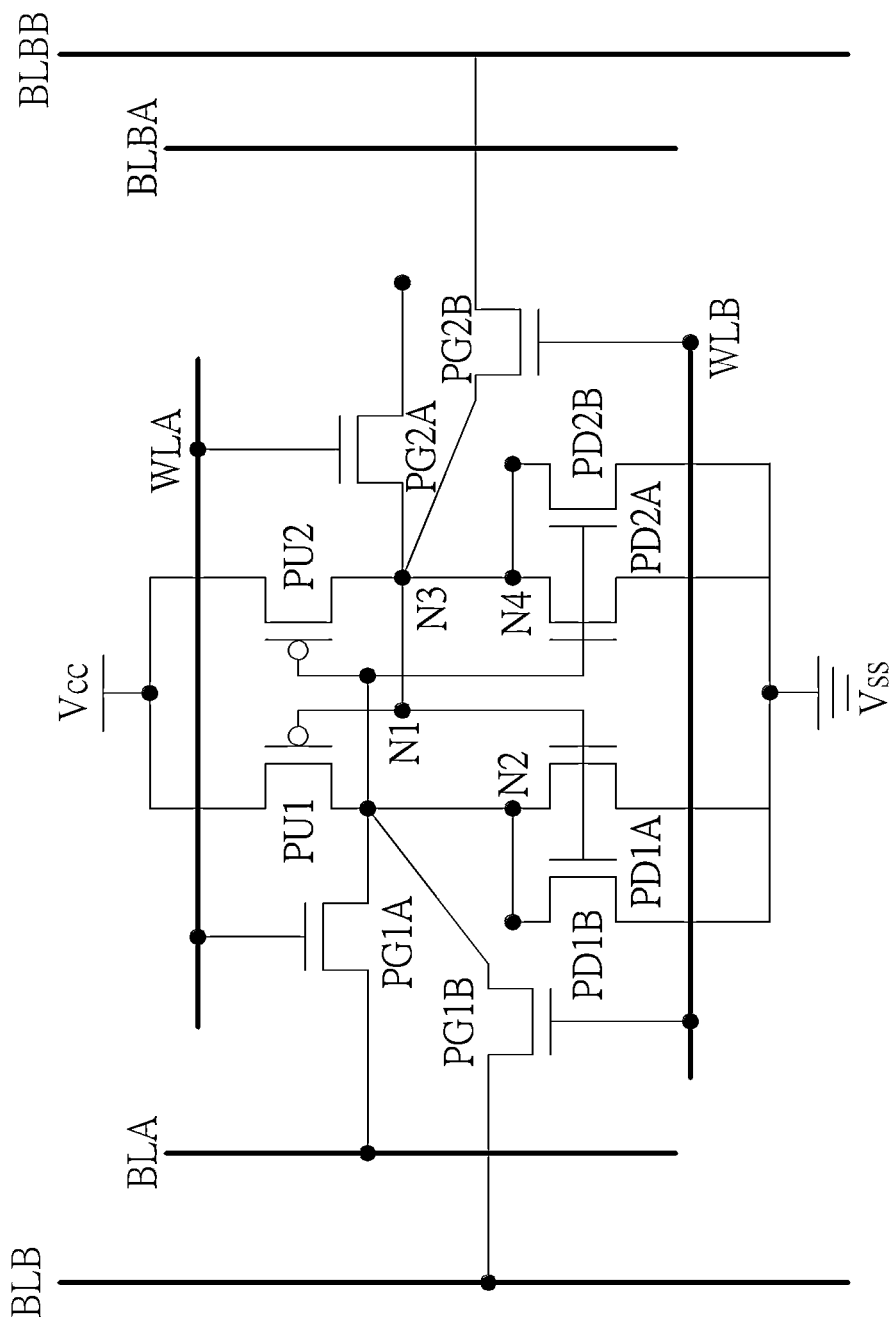
FIG. 1 illustrates a circuit diagram of a SRAM cell according to a first preferred embodiment of the present invention.

FIG. 1 illustrates a circuit diagram of a SRAM cell according to a first preferred embodiment of the present invention. As shown in FIG. 1, a SRAM cell 100 includes a first inverter and a second inverter which are mutually coupled. The first inverter includes a first pull-up transistor PU1 which can be, for example, a P-type transistor, a first pull-down transistor PD1A which can be, for example, an N-type transistor and a second pull-down transistor PD1B which can be, for example, an N-type transistor. The second inverter includes a second pull-up transistor PU2, for example, a P-type transistor, a third pull-down transistor PD2A, for example, an N-type transistor and a fourth pull-down transistor PD2B, for example, an N-type transistor. The first pull-down transistor PD1A and the second pull-down transistor PD1B are connected in parallel, and the third pull-down transistor PD2A and the fourth pull-down transistor PD2B are connected in parallel. The drain of the first pull-up transistor PU1 is connected to the node N1, and the drains of the first pull-down transistor PD1A and the second pull-down transistor PD1B are connected to the node N2, the node N1 and the node N2 are connected to each other. Similarly, the drain of the second pull-up transistor PU2 is connected to the node N3, and the drains of the third pull-down transistor PD2A and the fourth pull-down transistor PD2B are connected to the node N4, the node N3 and the node N4 are connected to each other. The gates of the first pull-up transistor PU1, the first pull-down transistor PD1A and the second pull-down transistor PD1B are electrically connected to the node N3 or the node N4. The gates of the second pull-up transistor PU2, the third pull-down transistor PD2A and the fourth pull-down transistor PD2B are electrically connected to the node N1 or the node N2. The sources of the first pull-down transistor PD1A, the second pull-down transistor PD1B, the third pull-down transistor PD2A and the fourth pull-down transistor PD2B are electrically connected to a voltage source Vss. In an embodiment, the source of the first pull-down transistor PD1A and the second pull-down transistor PD1B can be electrically connected with a voltage source, while the source of the third pull-down transistor PD2A and the fourth pull-down transistor PD2B can be electrically connected with another voltage source, and the two voltage sources are electrically connected with each other to form the same voltage source Vss, but the present invention is not limited to this. The source of the first pull-up transistor PU1 and the second pull-up transistor PU2 are electrically connected to a voltage source Vcc.

Furthermore, the SRAM cell 100 includes a first port Port-A and a second port Port-B. The first port Port-A and the second port Port-B each contain at least one access device. In this embodiment, the first port Port-A includes a first access transistor PG1A and a third access transistor PG2A, and the second port Port-B includes a second access transistor PG1B and a fourth access transistor PG2B. In this embodiment, the first access transistor PG1A, the second access transistor PG1B, the third access transistor PG2A and the fourth access transistor PG2B are all N-type transistors, but the present invention is not limited to this.

Specifically, the drain of the first access transistor PG1A is electrically connected to a first bit line BLA, the source of the first access transistor PG1A is electrically connected to the node N1, and the gate of the first access transistor PG1A is electrically connected to a first word line WLA. The drain of the second access transistor PG1B is electrically connected to a second bit line BLB, the source of the second access transistor PG1B is electrically connected to node N2 (the node N1 and the node N2 are connected to each other), and the gate of the second access transistor PG1B is electrically connected to a second word line WLB. The drain of the third access transistor PG2A is electrically connected to a third bit line BLBA, the source of the third access transistor PG2A is electrically connected to the node N3, and the gate of the third access transistor PG2A is electrically connected to the first word line WLA. The drain of the fourth access transistor PG2B is electrically connected to a fourth bit line BLBB, the source of the fourth access transistor PG2B is electrically connected to the node N4 (the node N3 and the node N4 are connected to each other), and the gate of the fourth access transistor PG2B is electrically connected to the second word line WLB. In this embodiment, the gates of the first access transistor PG1A and the third access transistor PG2A are directly electrically connected to a common first word line WLA, while the gates of the second access transistor PG1B and the fourth access transistor PG2B are electrically connected to a common second word line WLB. In other words, the first word line WLA connecting the gate of the first access transistor PG1A and the first word line WLA connecting the gate of the third access transistor PG2A are electrically connected to each other; The second word line WLB connecting the gate of the second access transistor PG1B and the second word line WLB connecting the gate of the fourth access transistor PG2B are electrically connected to each other.

In fact, the above 10 transistors can also include other combinations of P-type transistors and N-type transistors, and the SRAM cell 100 of the present invention can be applied to planar transistors or multi-gate field effect transistors.

Figure 2:
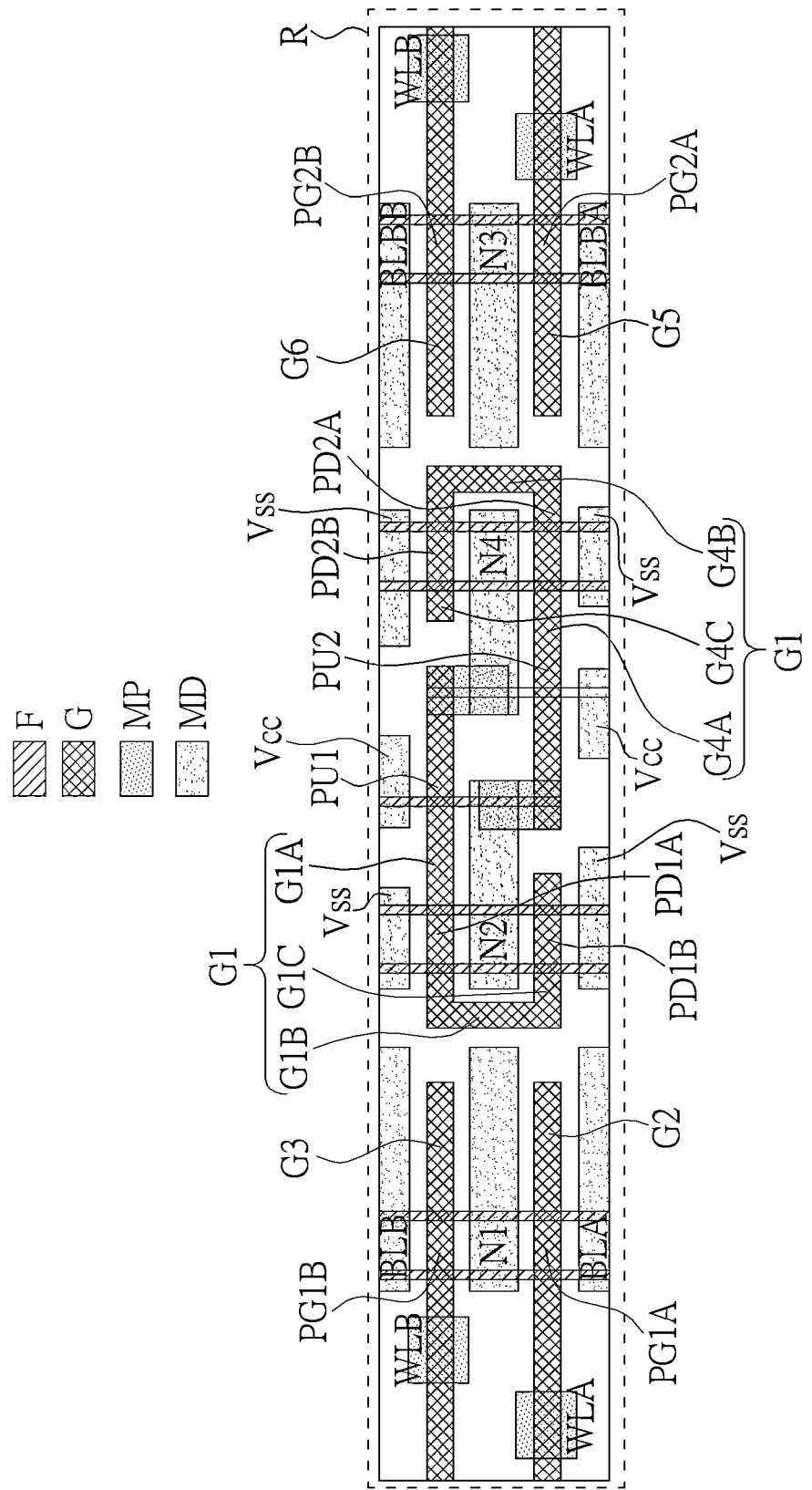
FIGS. 2-4 are layout diagrams of a SRAM according to a preferred embodiment of the present invention.
Figure 3:
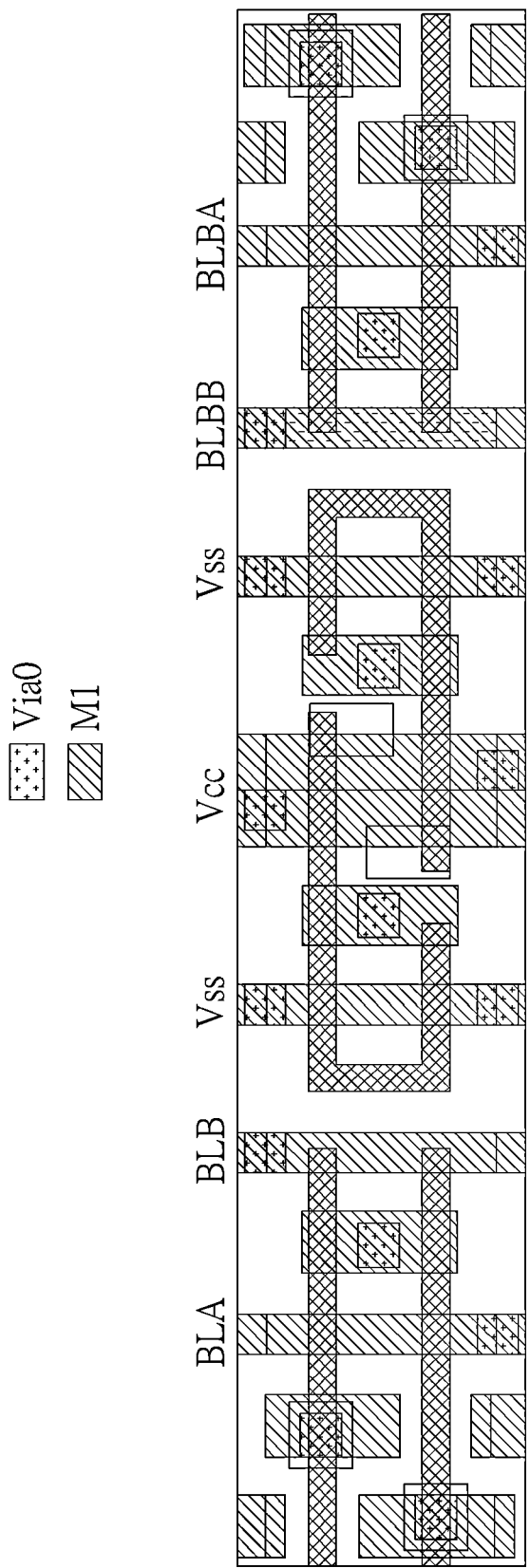
Figure 4:
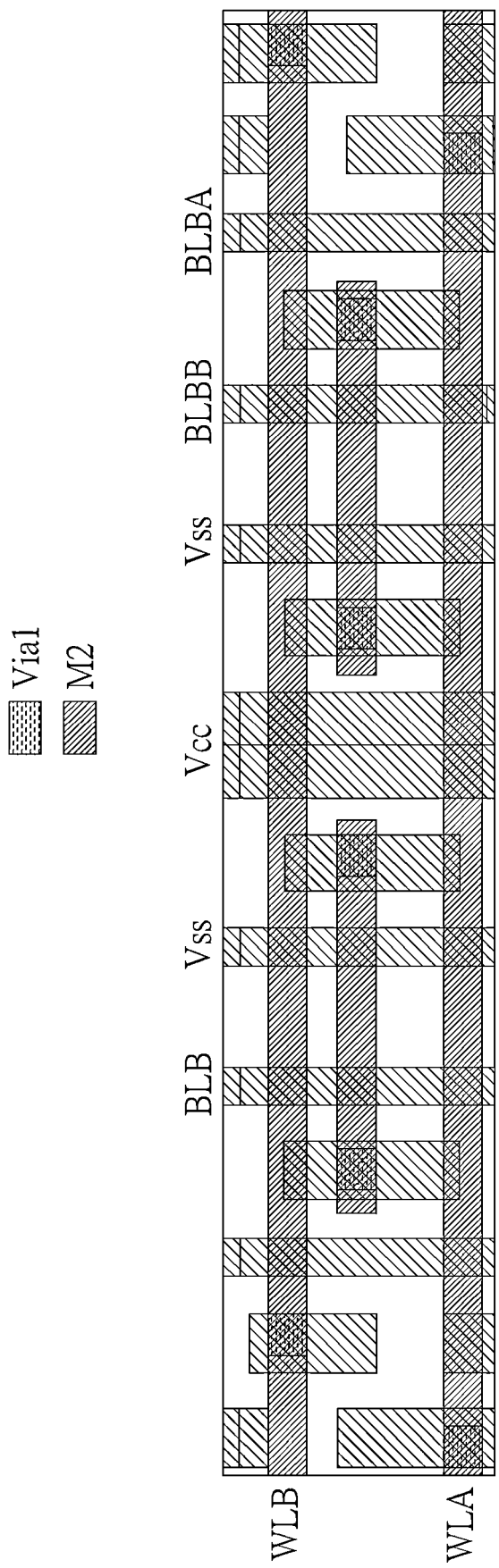

FIGS. 2-4 are layout diagrams of a SRAM according to a preferred embodiment of the present invention. In this embodiment, the SRAM cell 100 is located in a region R and is arranged on a substrate 10, such as a silicon substrate or an SOI substrate. A plurality of fin structures F arranged in parallel with each other are arranged on the substrate 10, and shallow trench isolation (not shown) is arranged around each fin structure F.

In addition, the substrate 10 contains a plurality of gate structures G. Each of the above-mentioned transistors (including the first pull-up transistor PU1, the second pull-up transistor PU2, the first pull-down transistor PD1A, the second pull-down transistor PD1B, the third pull-down transistor PD2A, the fourth pull-down transistor PD2B, the first access transistor PG1A, the second access transistor PG1B, the third access transistor PG2A and the fourth access transistor PG2B) has a gate structure G across the fin structures F.

As shown in FIG. 2, in order to clearly define the position of each gate structure G, the gate structures G are defined as a first gate structure G1, a second gate structure G2, a third gate structure G3, a fourth gate structure G4, a fifth gate structure G5 and a sixth gate structure G6. In which the first gate structure G1 crosses the fin structure F to form a first pull-up transistor PU1, a first pull-down transistor PD1A and a second pull-down transistor PD1B; The second gate structure G2 crosses the fin structure F to form the first access transistor PG1A; The third gate structure G3 crosses the fin structure F to form the second access transistor PG1B; The fourth gate structure G4 crosses the fin structure F to form the second pull-up transistor PU2, the third pull-down transistor PD2A and the fourth pull-down transistor PD2B; The fifth gate structure G5 crosses the fin structure F to form the third access transistor PG2A; The sixth gate structure G6 crosses the fin structure F to form the fourth access transistor PG2B. It can be understood that the first gate structures G1, G2, G3, G4, G5 and G6 all belong to the gate structure G.

In the present invention, the gate structures G2, G3, G5 and G6 are strip-shaped structures, all of which are arranged along a first direction (e.g., the X axis), and the fin structures F are arranged along a second direction (e.g., the Y axis). Preferably, the first direction and the second direction are perpendicular to each other.

It should be noted that the gate structures G1 and G4 in this embodiment have special shapes. More specifically, the gate structure G1 and the gate structure G4 have a J-shaped structure when viewed from the top view. For example, the gate structure G1 can include three parts, namely, the long side structure G1A arranged along the first direction, the connection structure G1B arranged along the second direction and the short side structure G1C arranged along the first direction, the length of the long side structure G1A is greater than that of the short side structure G1C. The long side structure G1A crosses the fin structure F to form the first pull-up transistor PU1 and the first pull-down transistor PD1A, while the short side structure G1C crosses the fin structure F to form the second pull-down transistor PD1B. In addition, the connection structure G1B connects the long side structure G1A with the short side structure G1C. Similarly, the gate structure G4 and the gate structure G1 are symmetrical along the center point, so the gate structure G4 can include three parts, namely, the long side structure G4A arranged along the first direction, the connecting structure G4B arranged along the second direction and the short side structure G4C arranged along the first direction, the length of the long side structure G4A is greater than that of the short side structure G4C. The long side structure G4A crosses the fin structure F to form the second pull-up transistor PU1 and the third pull-down transistor PD2A, while the short side structure G4C crosses the fin structure F to form the fourth pull-down transistor PD2B. In addition, the gate structure G1 and the gate structure G4 are both integrally formed structures. In other words, taking the gate structure G1 as an example, the long side structure G1A, the connection structure G1B and the short side structure G1C are connected with each other, made of the same material and formed at the same time.

In the region R, there are also a plurality of metal layers, where the metal layer partially connected to the gates of each transistor is defined as MP, and the metal layer connected to the source/drain of each transistor is defined as MD. In FIG. 2, the metal layer MP and the metal layer MD are represented by different meshes. In addition, for clearer explanation, transistors, nodes, word lines, bit lines, voltage sources, etc. connected to each element are also marked on the metal layers MP, MD or the gate structure G in FIG. 2 to clearly show the connection relationship of each element.

In the layout diagram of FIG. 2, the gate structures G1, G4 include a J-shaped structure, and the long side structures G1A, G4A and short side structures G1C, G4C of the J-shaped structure span the fin structure F to form different transistors. By making the gate structures into a curved shape, more transistors can be accommodated in a limited space, which is helpful to reduce the size of the device. In addition, it can also avoid the problem of uneven stress distribution in part of the space in the region R because no transistor is formed.

Next, as shown in FIG. 3 and FIG. 4, a plurality of contact plugs (via) and metal trace are continuously formed on the metal layers MP and MD and the gate structure G to connect each transistor to the corresponding devices, voltage sources, word lines, bit lines, etc. As shown in FIG. 3, a plurality of contact plugs Via0 and a plurality of metal wires M1 are formed, and then as shown in FIG. 4, a plurality of contact plugs Via1 and a plurality of metal wires M2 are further formed. In addition, node N1 and node N2 and node N3 and node N4 can also be connected by the contact plugs Via0 and Via1 and a plurality of metal wires M1 and M2. In addition, in order to simplify the drawings, in FIG. 3 and FIG. 4, some elements belonging to the layout pattern of the previous layer are not labeled, but only different meshes are used to represent each element. For these unlabeled elements, please refer to FIG. 2 to clearly know their positions.

Figure 5:
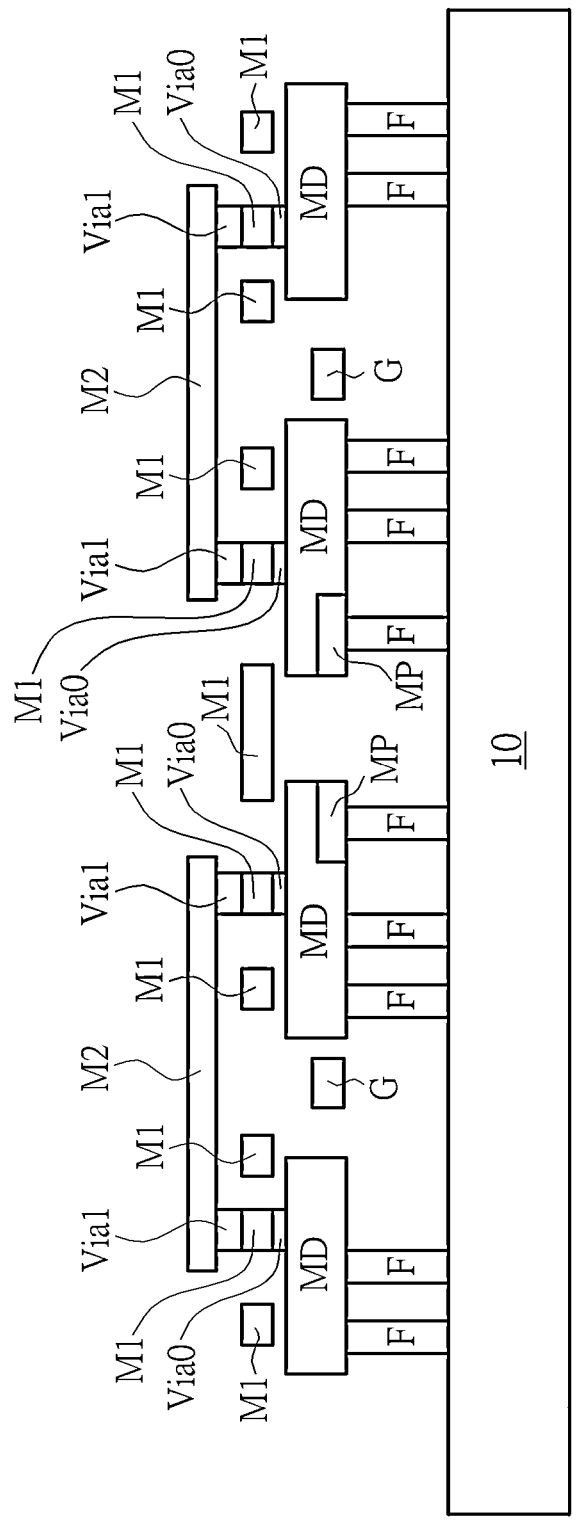
FIG. 5 is a schematic view of the sectional structure taken along section line A-A' in FIG. 4.

Please refer to FIG. 5, which is a schematic view of the sectional structure taken along the section line A-A' in FIG. 4. FIG. 5 shows the substrate 10, fin structure F, gate structure G, metal layer MP, metal layer MD, contact plug Via0, contact plug Via1, metal wire M1, metal wire M2 and other elements. It should be noted that the above-mentioned elements should be formed in a dielectric layer (not shown), but the dielectric layer is omitted and not drawn in FIG. 5 for simplicity of drawing, but it can be understood that the dielectric layer should exist in the SRAM memory cell of the present invention.

As can be seen from the top view of FIG. 2 and the cross-sectional structure of FIG. 5, in order to form a J-shaped gate structure G1 (or the J-shaped gate structure G4, hereinafter, the J-shaped gate structure G1 will be taken as an example), the metal layer MD connecting the nodes N1 and N2 is separated by the connection structure G1B of the gate structure G1. Then, in order to electrically connect the node N1 and the node N2 with each other, elements such as contact plug Via0, contact plug Via1, metal wire M1 and metal wire M2 are continuously formed. In this way, the node N1 and the node N2 can be electrically connected again, and no extra process is required (because in the process, it is necessary to form elements such as contact plug Via0, contact plug Via1, metal wire M1 and metal wire M2 to connect bit lines, word lines, voltage sources, etc.). Therefore, in the present invention, the gate structures G1 and G4 with curved shapes are manufactured without adding additional processes, so that the area in the region R can be effectively utilized, and the problem of uneven stress that may occur in the region R can be reduced.

In addition, although the above embodiment has formed a fin structure, each transistor should be a three-dimensional fin transistor (FinFET), but the present invention may also replace the fin structure with a doped region in the substrate and replace the above FinFET with a planar transistor, and this embodiment also falls within the scope of the present invention.

Based on the above description and drawings, the layout pattern 100 of SRAM of the present invention at least includes a plurality of fin structures F on a substrate 10 and a plurality of gate structures G on the substrate 10, the plurality of gate structures G span the plurality of fin structures F, a first pull-up transistor PU1, a second pull-up transistor PU2, a first pull-down transistor PD1A, a second pull-down transistor PD1B, a third pull-down transistor PD2A, a fourth pull-down transistor PD2B, a first access transistor PG1A, a second access transistor PG1B, a third access transistor PG2A and a fourth access transistor PG2B are located on the substrate 10. In which the first pull-down transistor PD1A and the second pull-down transistor PD1B are connected in parallel with each other, the third pull-down transistor PD2A and the fourth pull-down transistor PD2B are connected in parallel with each other, a plurality of gate structures include a first j-shaped gate structure G1, which spans a part of the fin structure F and constitutes a first pull-up transistor PU1, a first pull-down transistor PD1A and a second pull-down transistor PD1B. The first J-shaped gate structure G1 includes a long side structure G1A, a short side structure G1C and a connection structure G1B, and the first J-shaped gate structure G1 is an integrally formed structure.

In some embodiments of the present invention, the long side structure G1A and the short side structure G1C are arranged along a first direction (X direction), and the connecting structure G1B and each fin structure are arranged along a second direction (Y direction).

In some embodiments of the present invention, the short side structure G1C of the first J-shaped gate structure G1 spans a part of the fin structure F and constitutes the second pull-down transistor PD1B.

In some embodiments of the present invention, the long side structure G1A of the first J-shaped gate structure G1 spans a part of the fin structure F and constitutes the first pull-up transistor PU1 and the first pull-down transistor PD1A.

In some embodiments of the present invention, it further includes a second gate structure G2 arranged along the first direction, and the second gate structure G2 spans a part of the fin structure F and constitutes the first access transistor PG1A.

In some embodiments of the present invention, the second gate structure G2 and the short side structure G1B are aligned with each other in the first direction.

In some embodiments of the present invention, it further includes a third gate structure G3 arranged along the first direction, and the third gate structure G3 spans a part of the fin structure F and constitutes the second access transistor PG1B.

In some embodiments of the present invention, the third gate structure G3 and the long side structure G1A are aligned with each other in the first direction.

In some embodiments of the present invention, it further comprises a first local interconnection layer (the metal layer MD connecting node N1) and a second local interconnection layer (the metal layer MD connecting node N2), wherein the first local interconnection layer MD is located between the second gate structure and the third gate structure.

In some embodiments of the present invention, the second local interconnection layer MD is located between the long side structure G1A and the short side structure G1C.

In some embodiments of the present invention, the connection structure G1B is located between the first local interconnection layer (the metal layer MD connecting node N1) and the second local interconnection layer (the metal layer MD connecting node N2).

In some embodiments of the present invention, a metal wire M2 is further included to electrically connect the first local interconnection layer MD and the second local interconnection layer MD, wherein the metal wire M2 and the connection structure G1B are located in different layers.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A layout pattern of a static random access memory (SRAM), comprising:
    a plurality of fin structures located on a substrate;
    a plurality of gate structures located on the substrate, wherein the plurality of gate structures span the plurality of fin structures, to form a PU1 (first pull-up transistor), a PU2 (second pull-up transistor), a PD1A (first pull-down transistor), a PD1B (second pull-down transistor), a PD2A (third pull-down transistor), a PD2B (fourth pull-down transistor), a PG1A (first access transistor), a PG1B (second access transistor), a PG2A (third access transistor) and a PG2B (fourth access transistor) on the substrate, wherein the PD1A and the PD1B are connected in parallel, and the PD2A and the PD2B are connected in parallel;
    wherein the plurality of gate structures include a first J-shaped gate structure, the first J-shaped gate structure spans a part of the fin structures and forms the PU1, the PD1A and the PD1B, the first J-shaped gate structure comprises a long side structure, a short side structure and a connection structure, and the first J-shaped gate structure is an integrally formed structure; and
    a third gate structure disposed beside the long side structure of the first J-shaped gate structure, and the third gate structure spans a part of the fin structures and constitutes the PG1B, wherein the connection structure of the first J-shaped gate structure is disposed between the third gate structure and the short side structure of the first J-shaped gate structure.

2. The layout pattern of SRAM according to claim 1, wherein the long side structure and the short side structure are arranged along a first direction, and the connection structure and each fin structure are arranged along a second direction.

3. The layout pattern of SRAM according to claim 1, wherein the short side structure of the first J-shaped gate structure spans a part of the fin structures and constitutes the PD1B.

4. The layout pattern of SRAM according to claim 1, wherein the long side structure of the first J-shaped gate structure spans a part of the fin structures and constitutes the PU1 and the PD1A.

5. The layout pattern of SRAM according to claim 2, further comprising a second gate structure arranged along the first direction, and the second gate structure spans a part of the fin structures and constitutes the PG1A.

6. The layout pattern of SRAM according to claim 5, wherein the second gate structure and the short side structure are aligned with each other in the first direction.

7. The layout pattern of SRAM according to claim 6, wherein the third gate structure and the long side structure are aligned with each other in the first direction.

8. The layout pattern of SRAM according to claim 7, further comprising a first local interconnection layer and a second local interconnection layer, wherein the first local interconnection layer is located between the second gate structure and the third gate structure.

9. The layout pattern of SRAM according to claim 8, wherein the second local interconnection layer is located between the long side structure and the short side structure.

10. The layout pattern of SRAM according to claim 9, wherein the connection structure is located between the first local interconnection layer and the second local interconnection layer.

11. The layout pattern of SRAM according to claim 8, further comprising a metal wire electrically connecting the first local interconnection layer and the second local interconnection layer, wherein the metal wire and the connection structure are located in different layers.

* * * * *